United States Patent
Defranco et al.

(10) Patent No.: US 10,503,074 B2
(45) Date of Patent: Dec. 10, 2019

(54) PHOTOLITHOGRAPHIC PATTERNING OF DEVICES

(71) Applicant: ORTHOGONAL, INC., Rochester, NY (US)

(72) Inventors: John Andrew Defranco, Rochester, NY (US); Charles Warren Wright, Fairport, NY (US); Douglas Robert Robello, Webster, NY (US); Frank Xavier Byrne, Webster, NY (US); Diane Carol Freeman, Pittsford, NY (US); Terrence Robert O'Toole, Webster, NY (US)

(73) Assignee: Orthogonal, Inc., Rochester, NY (US)

( * ) Notice: Subject to any disclaimer, the term of this patent is extended or adjusted under 35 U.S.C. 154(b) by 0 days.

(21) Appl. No.: 15/501,116

(22) PCT Filed: Jul. 31, 2015

(86) PCT No.: PCT/US2015/043034
§ 371 (c)(1),
(2) Date: Feb. 1, 2017

(87) PCT Pub. No.: WO2016/019210
PCT Pub. Date: Feb. 4, 2016

(65) Prior Publication Data
US 2017/0222148 A1    Aug. 3, 2017

Related U.S. Application Data

(60) Provisional application No. 62/031,903, filed on Aug. 1, 2014.

(51) Int. Cl.
*G03F 7/42* (2006.01)
*H01L 51/00* (2006.01)
*G03F 7/40* (2006.01)
*H01L 21/027* (2006.01)
*G03F 7/09* (2006.01)
*H01L 51/56* (2006.01)

(52) U.S. Cl.
CPC ............... *G03F 7/42* (2013.01); *G03F 7/094* (2013.01); *G03F 7/40* (2013.01); *H01L 21/0272* (2013.01); *H01L 21/0274* (2013.01); *H01L 51/0018* (2013.01); *H01L 51/0016* (2013.01); *H01L 51/56* (2013.01); *Y02E 10/549* (2013.01); *Y02P 70/521* (2015.11)

(58) Field of Classification Search
CPC ..................................... G03F 7/40; G03F 7/30
See application file for complete search history.

(56) References Cited

U.S. PATENT DOCUMENTS

| | | | |
|---|---|---|---|
| 4,720,432 A | 1/1988 | VanSlyke et al. | |
| 5,776,623 A | 7/1998 | Hung et al. | |
| 6,013,538 A | 1/2000 | Burrows et al. | |
| 6,208,075 B1 | 3/2001 | Hung et al. | |
| 6,720,573 B2 | 4/2004 | Son et al. | |
| 7,684,868 B2 * | 3/2010 | Tai | H01F 7/06 607/54 |
| 7,830,080 B2 | 11/2010 | Tanada | |
| 7,955,719 B2 | 6/2011 | Hatwar et al. | |
| 8,106,582 B2 | 1/2012 | Yamamichi et al. | |
| 8,587,003 B2 | 11/2013 | Ando | |
| 8,846,301 B2 | 9/2014 | Ober et al. | |
| 9,034,736 B2 | 5/2015 | Sirringhaus et al. | |
| 9,054,341 B2 | 6/2015 | Kim et al. | |
| 9,091,913 B2 | 7/2015 | Katz et al. | |
| 9,104,104 B2 | 8/2015 | Wright et al. | |
| 9,298,088 B2 | 3/2016 | Robello et al. | |
| 9,500,948 B2 | 11/2016 | Wright et al. | |
| 9,541,829 B2 | 1/2017 | Robello et al. | |
| 9,806,099 B2 | 10/2017 | Yamazaki et al. | |
| 9,899,636 B2 | 2/2018 | DeFranco et al. | |
| 9,941,309 B2 | 4/2018 | Yamazaki et al. | |
| 2004/0211956 A1 | 10/2004 | Kanno et al. | |
| 2005/0153058 A1 | 7/2005 | Tachikawa et al. | |
| 2008/0124824 A1 | 5/2008 | Tsai et al. | |
| 2010/0193778 A1 | 8/2010 | An et al. | |
| 2010/0289019 A1 | 11/2010 | Katz et al. | |
| 2011/0101317 A1 | 5/2011 | Gregory et al. | |
| 2011/0159252 A1 | 6/2011 | Ober et al. | |
| 2011/0309389 A1 | 12/2011 | Yu et al. | |
| 2012/0252149 A1 | 10/2012 | Hiroki et al. | |
| 2012/0305897 A1 | 12/2012 | Ober et al. | |
| 2013/0075768 A1 | 3/2013 | Kim et al. | |
| 2013/0084664 A1 | 4/2013 | Yoshitoku et al. | |
| 2013/0126833 A1 | 5/2013 | Endo et al. | |
| 2013/0137205 A1 | 5/2013 | Moriyama et al. | |
| 2014/0127625 A1 | 5/2014 | Defranco et al. | |
| 2014/0154827 A1 | 6/2014 | Lee et al. | |
| 2014/0197378 A1 | 7/2014 | Lecloux et al. | |
| 2014/0197379 A1 | 7/2014 | Li | |

(Continued)

FOREIGN PATENT DOCUMENTS

EP    0 924 245         6/1999
EP    2 784 839 A1    10/2014

(Continued)

OTHER PUBLICATIONS

Malinowski, P. et al., "True-Color 640 ppi OLED Arrays Patterned by CA i-line Photolithography", SID 2015 Digest, 215-218 (2015).

(Continued)

*Primary Examiner* — Kathleen Duda
(74) *Attorney, Agent, or Firm* — Merchant & Gould P.C.

(57) ABSTRACT

A method of making a device includes providing a fluorinated material layer over the device substrate having one or more target areas for patterning. One or more lift-off structures are formed at least in part by developing a first pattern of one or more open areas in the fluorinated material layer in alignment with the one or more target areas by contact with a developing agent including a fluorinated solvent which dissolves the fluorinated material at a first rate. After patterning, the lift-off structures are removed by contact with a lift-off agent including a fluorinated solvent wherein the lift-off agent dissolves the fluorinated material at a second rate that is at least 150 nm/sec and higher than the first rate.

24 Claims, 5 Drawing Sheets

(56) References Cited

U.S. PATENT DOCUMENTS

| | | |
|---|---|---|
| 2014/0319499 A1 | 10/2014 | Yamazaki et al. |
| 2014/0322656 A1 | 10/2014 | Wright et al. |
| 2014/0356789 A1 | 12/2014 | Wright et al. |
| 2015/0000976 A1 | 1/2015 | Frohler et al. |
| 2015/0132699 A1 | 5/2015 | Robello et al. |
| 2015/0140729 A1 | 5/2015 | Ferro et al. |
| 2016/0027763 A1 | 1/2016 | Cope |
| 2016/0049518 A1 | 2/2016 | Endo |
| 2016/0164040 A1 | 6/2016 | Kurata et al. |
| 2017/0236849 A1 | 8/2017 | Endo |

FOREIGN PATENT DOCUMENTS

| | | |
|---|---|---|
| WO | 02/04534 A1 | 1/2002 |
| WO | 2011/015808 A1 | 2/2011 |
| WO | 2011/139771 A2 | 11/2011 |
| WO | 2011/139774 A2 | 11/2011 |
| WO | 2012/118713 A2 | 9/2012 |
| WO | 2012/143817 A2 | 10/2012 |
| WO | 2012/148884 A2 | 11/2012 |
| WO | 2013/074622 A1 | 5/2013 |
| WO | 2014/053202 A1 | 4/2014 |
| WO | 2015/013396 A1 | 1/2015 |
| WO | 2015/028407 A1 | 3/2015 |
| WO | 2015/120025 A1 | 8/2015 |
| WO | 2016/019212 A1 | 2/2016 |
| WO | 2016/019273 A1 | 2/2016 |
| WO | 2016/019277 A1 | 2/2016 |

OTHER PUBLICATIONS

Yamamoto, H. et al., "Understanding Extrinsic Degradation in Phosphorescent OLEDs", SID 2014 Digest, 758-761 (2014).

Krotkus, S. et al., "Influence of bilayer processing on p-i-n OLEDs: towards multicolor photolithographic structuring of Organic displays", Proc. of SPIE, 9360: 93600W-1-93600W-10 (2015).

Krotkus, S. et al., "Photo-patterning of Highly Efficient State-of-the-Art Phosphorescent OLEDs Using Orthogonal Hydrofluoroethers", Adv. Optical Mater., 2(11): 1043-1048 (2014).

"LOR and PMGI Resists", MicroChem Data Sheet, 7 pages (2006).

Sakanoue, T. et al., "Fluorosurfactant-assisted photolithography for patterning of perfluoropolymers and solution-processed organic semiconductors for printed displays", Applied Physics Express, 7: 101602-1-101602-4 (2014).

International Search Report for corresponding International Patent Application No. PCT/US2015/043034 dated Dec. 15, 2015, 2 pgs.

Extended European Search Report for corresponding European Patent Application No. 15828244.2 dated Oct. 19, 2018, 13 pages.

Partial Supplementary European Search Report for corresponding European Patent Application No. 15828244.2 dated Jul. 16, 2018, 16 pages.

* cited by examiner

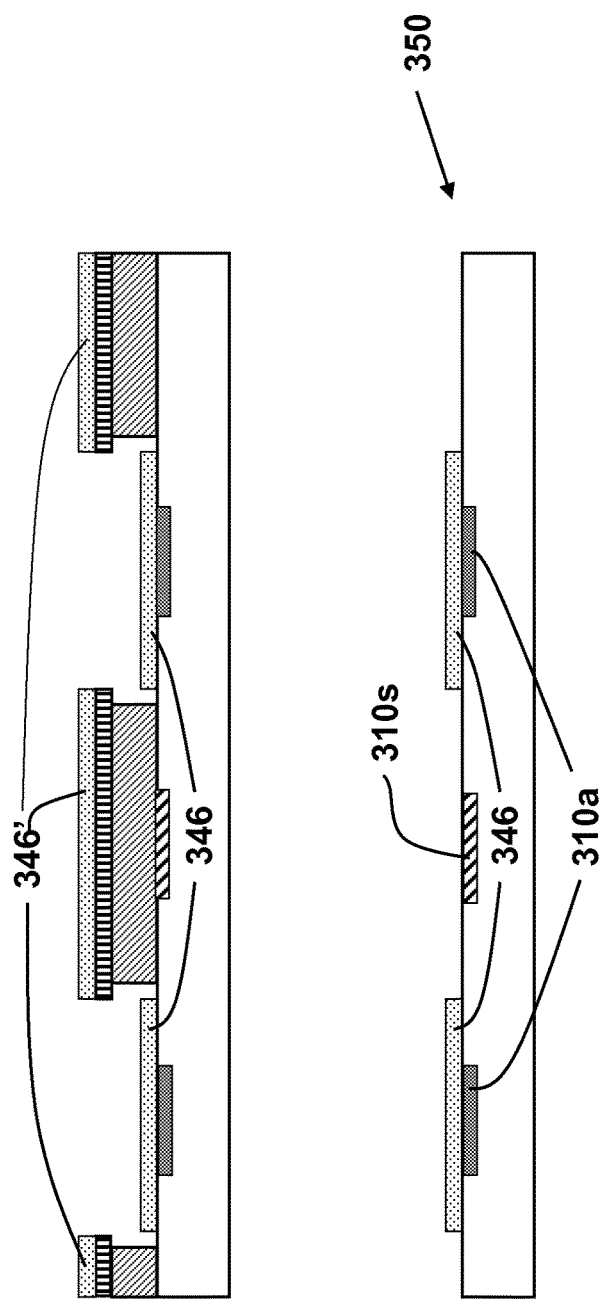

PHOTOLITHOGRAPHIC PATTERNING OF DEVICES

CROSS-REFERENCE TO RELATED APPLICATIONS

This application is a National Stage Application of PCT/US2015/043034 filed on Jul. 31, 2015, which claims the benefit of U.S. Provisional Application No. 62/031,903, filed on Aug. 1, 2014, and which applications are incorporated herein by reference. A claim of priority is made to each of the above disclosed applications. This application is also related to PCT International Applications, filed on Jul. 31, 2015 and claiming the benefit of U.S. Provisional Applications Nos. 62/031,888 (filed on Aug. 1, 2014), 62/031,891 (filed on Aug. 1, 2014), and 62/031,897 (filed on Aug. 1, 2014) and 62/096,582 (filed on Dec. 24, 2014), respectively.

BACKGROUND

1. Field of the Disclosure

The present disclosure relates to patterning of organic, electronic and organic electronic devices. The disclosed methods and materials are particularly useful for patterning OLED devices.

2. Discussion of Related Art

Organic electronic devices may offer significant performance and price advantages relative to conventional inorganic-based devices. As such, there has been much commercial interest in the use of organic materials in electronic device fabrication. For example, displays based on organic light-emitting diode (OLED) technology have recently gained popularity and offer numerous advantages over many other display technologies, Although solution-deposited OLED materials have been developed, the highest-performing OLED devices typically use vapor-deposited thin films of active organic materials.

A key challenge for full-color OLED displays is patterning the array of red, green and blue pixels. For vapor-deposited OLEDs, a fine metal mask having openings corresponding to the fineness of the desired pattern is conventionally used. However, a vapor deposited film builds up on the mask which may eventually narrow the mask openings or cause deforming stresses on the mask. Therefore, it is necessary to clean the mask after a certain number of uses, which is disadvantageous from the viewpoint of manufacturing costs. In addition, when a fine metal mask is increased in size to accommodate larger substrates, the positional accuracy of the mask openings becomes much more difficult, both from the standpoint of initial alignment and then maintaining the alignment during deposition due to thermal expansion issues. Positional accuracy may be improved to a degree by enhancing the stiffness of a flame of the mask, but this increase the weight of the mask itself causes other handling difficulties. Thus, a need exists for cost-effective patterning of organic electronic devices such as OLED devices, and particularly those having pattern dimensions of less than about 100 µm.

In addition to the challenges of patterning organic devices, so-called lift-off photolithography methods are used in specialized fields, but not widely accepted in industry, even for devices that utilize less sensitive materials. Lift-off resists ("LOR") are commercially available, for example, bilayer structures based on polydimethylglutarimide (PMGI) with conventional photoresists, but have some disadvantages. To control undercut, the PMGI must be soft-baked under careful conditions, typically in a range of 150 to 200° C. Some substrates include materials that are not compatible with such temperatures. The lift-off agent for PMGI typically requires flammable solvents such as cyclopentanone which need to be heated. Even heated, the dissolution rate is slow, e.g., just 38 nm/sec at 40° C. Thus, even higher temperatures are recommended, e.g., 60° C. which is not ideal from a safety standpoint. Further, the recommended lift-off time is 30 minutes even at 60° C., which is not cost effective in many manufacturing settings. Sonication at high temperatures is therefore recommended to reduce time, but sonication may not be compatible with sensitive device architectures. Thus, there continues to be a need for improved lift-off materials and methods that are more manufacturable and less hazardous.

SUMMARY

The authors have developed highly effective lift-off resist systems that use fluorinated materials such as fluorinated polymers and hydrofluoroether-based processing agents. The materials and methods disclosed enable high resolution patterning of sensitive organic devices such as OLED devices. Further, the fluorinated materials are easy to use, non-flammable, gentle on a wide variety of substrates, and provide much faster lift-off than available with more hazardous conventional lift-off systems.

In accordance with the present disclosure a method of making a device includes: providing a device substrate having one or more target areas for patterning; providing a fluorinated material layer over the device substrate; forming one or more lift-off structures at least in part by developing a first pattern of one or more open areas in the fluorinated material layer in alignment with the one or more target areas by contact with a developing agent comprising a fluorinated solvent, wherein the developing agent dissolves the fluorinated material at a first rate; patterning the device substrate by i) etching at least a portion of the one or more target areas using the one or more lift-off structures as an etch mask, ii) depositing one or more active material layers through the first pattern of open areas and onto the one or more target areas, or both i) and ii): and removing the one or more lift-off structures by contact with a lift-off agent comprising a fluorinated solvent wherein the lift-off agent dissolves the fluorinated material at a second rate that is at least 150 mn/sec and higher than the first rate.

In accordance with another aspect of the present disclosure a photoresist system to includes: a fluorinated material composition comprising a hydrofluoroether coating solvent and fluorinated copolymer that is not perfluorinated comprising at least two distinct repeating units including a first repeating unit having a fluorine-containing alkyl group and a second repeating unit having a non-photoactive functional group that does not include a erotic substituent, wherein the copolymer has a total fluorine content of at least 45% by weight; and a photoresist composition comprising a non-fluorinated organic solvent and a photosensitive polymer.

DETAILED DESCRIPTION

Figure 1:
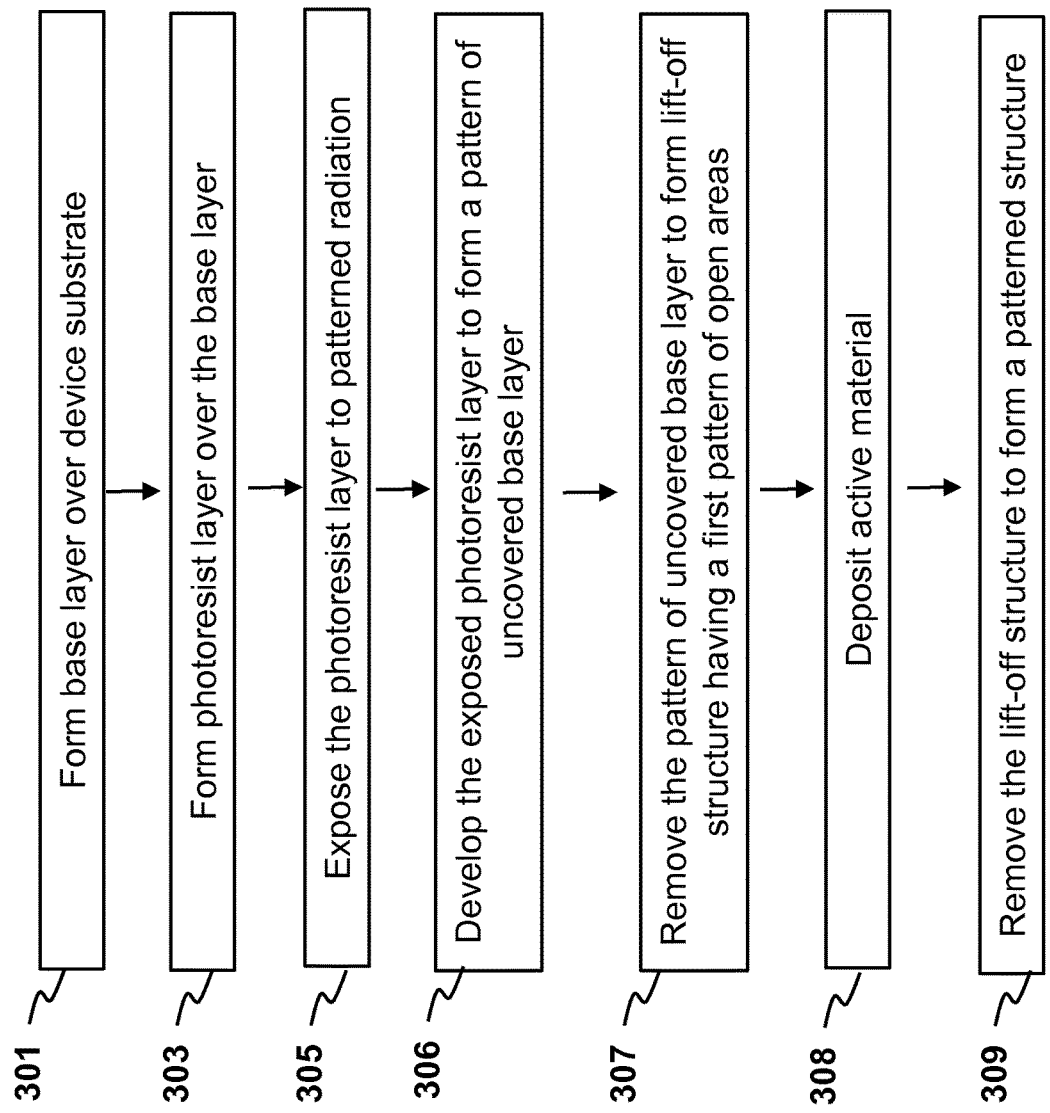
FIG. 1 is a flow chart depicting the steps in an embodiment of the present disclosure.

It is to be understood that the attached drawings are for purposes of illustrating the concepts of the disclosure and may not be to scale.

In one aspect of the present disclosure, "orthogonal" resist structures and processing agents are selected that are compatible with many sensitive organic electronic devices and materials such as OLED devices and materials, i.e., they are chosen to have low interaction with sensitive device layers that are not intended to be dissolved or otherwise damaged. Conventional photoresist materials typically use harsh organic solvents and often strongly caustic developers that can easily damage one or more layers of an OLED device. Even devices not using sensitive organic electronic materials may nevertheless include materials that are affected or degraded by such harsh traditional photolithographic solvents. Particularly useful orthogonal photoresist structures and processing agents include fluorinated polymers or molecular solids and fluorinated solvents. Some orthogonal photoresist structures and systems are disclosed in U.S. patent application Ser. Nos. 12/864,407, 12/994,353, 14/113,408, and 14/291,692, the contents of which are incorporated by reference. The photoresist structures of the present disclosure may optionally have an undercut profile, which can be advantageous in so-called "lift-off" photolithographic patterning. Such photoresist structures may also be referred to herein as lift-off structures. The photoresist structure may be a single layer, a bilayer or multilayer structure. It is preferred that at least the layer or portion of the photoresist structure in contact with the substrate is a fluorinated polymer or molecular solid provided, e.g., from a fluorinated coating solvent or by vapor deposition. Orthogonality can be tested by, for example, immersion of a device comprising the material layer of interest into a target composition prior to operation (e.g., into a coating solvent, a developing agent, a lift-off agent, or the like). The composition is orthogonal if there is no serious reduction in the functioning of the device.

Certain embodiments disclosed in the present disclosure are particularly suited to the patterning of solvent-sensitive active organic materials. Examples of active organic materials include, but are not limited to, organic electronic materials, such as organic semiconductors, organic conductors, OLED (organic light-emitting diode) materials and organic photovoltaic materials, organic optical materials and biological materials (including bioelectronics materials). Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are coated by vapor deposition, for example, by sublimation from a heated organic material source at reduced pressure. Solvent-sensitive, active organic materials can also include composites of organics and inorganics. For example, the composite may include inorganic semiconductor nanoparticles (quantum dots). Such nanoparticles may have organic ligands or be dispersed in an organic matrix. The present disclosure is particularly directed towards patterning of OLED devices, but the concepts and methods disclosed herein can be applied to other organic electronic or bioelectronic devices, and to devices in general including more traditional inorganic materials.

Lift-Off Structures

A lift-off structure in the present disclosure includes a lop portion that has less solubility in a lift-off agent than a lower portion. In an embodiment, at least a lower portion of the lift-off structure is soluble in a solvent that is orthogonal to an underlying device structure and the dissolution of this portion enables the separation of unwanted portions of the lift-off structure or overlying deposited material. In an embodiment, the lift-off structure has a substantially vertical sidewall profile (e.g., 90°±10° relative to the substrate), or alternatively, an undercut sidewall profile. The undercut reduces the amount of material that deposits on the sidewalls (in embodiments where the material for patterning is provided over the lift-off structure) so that the sidewalls remain unblocked to an appropriate lift-off agent. The thickness of the lift-off structure depends on the particular type of device and intended dimensions, but in general, it is in a range of 0.1 to 10 µm, alternatively in a range of 0.2 to 5 µm, or alternatively in a range of 0.5 to 3 µm. If the lift-off structure is used as an etch mask only (not used as a materials deposition mask), the sidewalls do not necessarily need to be vertical or undercut.

An important feature of the lift-off structure is that it not harm underlying device layers, neither in the lift-off structure's formation nor its subsequent processing. Further, it is important that the materials allow for rapid processing, e.g., short lift-off times. In an embodiment, the lift-off structure includes a layer of a fluorinated material in contact with one or more underlying device layers optionally comprising an active organic material. In one embodiment, the fluorinated material is photosensitive and can form the lift-off structure by exposure to radiation and development. Such a material may be a positive working (portions exposed to radiation are removed during development) or negative working (portions not exposed to radiation are removed during development). Examples of photosensitive fluorinated materials include those disclosed in U.S. patent application Ser. Nos. 12/994, 353, 14/113,408, and 14/291,692. In an embodiment, the photosensitive fluorinated material is a negative working photopolymer provided from a fluorinated solvent, e.g., a hydrofluoroether. In an embodiment, the photosensitive fluorinated photopolymer is developed in a developing agent comprising one or more fluorinated solvents, e.g., a hydrofluoroether. In an embodiment, a lift-off agent for use with a photosensitive fluorinated photopolymer includes a fluorinated solvent, e.g., a hydrofluoroether.

It can be challenging to achieve necessary photosensitivity, sidewall profile and orthogonality in a single layer lift-off structure. In an embodiment, the lift-off structure includes multiple layers, e.g., as shown in FIG. 2 and as described in U.S. patent application Ser. No. 12/864,407, the contents of which are incorporated by reference. In an embodiment, a material layer comprising a fluorinated material such as a fluorinated molecular solid or fluorinated polymer is provided over a device substrate that may include an active organic material. The fluorinated material may be vapor deposited (e.g., if a molecular solid) or coated from a highly fluorinated solvent including, but not limited to, a hydrofluoroether or a perfluorinated solvent. This layer forms the base of the multi-layer lift-off structure and is designed to be chemically inert relative to the underlying device substrate. It does not require photo-active elements such as photoacid generators or reactive groups that may, in some cases, harm the underlying device. The base layer may optionally comprise a light absorbing material to protect the underlying device from potentially high-intensity radiation of the overlying photoresist layer (see below) if used. If so, the light absorbing material is preferably incorporated into base the layer covalently, e.g., by attaching a light absorbing dye to a fluorinated polymer. The base layer is further designed to be readily soluble in a fluorinated or other orthogonal solvent to enable rapid lift-off as described below.

Over the base layer, e.g., a fluorinated material layer, a patterned resist layer formed. This can be done by pattern imprinting a resist material, e.g., by ink jet printing, flexographic printing, gravure printing, screen printing, electrophotographic printing, or laser or thermal transfer of the resist material from a donor sheet. Alternatively, the patterned resist layer is formed using a photoresist that is applied, e.g., from a coating solvent or by lamination, exposed to patterned radiation and developed in a photoresist developing agent. The photoresist can be a conventional photoresist (positive or negative tone) coated from, or processed with, solvents that would normally be harmful to the underlying device substrate, but the fluorinated material layer (base layer) blocks or limits penetration of such harmful materials. When exposed to appropriate radiation, and optionally heat, the photoresist transforms in some way to alter its solubility relative to unexposed photoresist. For example, exposure may activate solubility-altering switching groups, induce cross-linking or cause chain scission.

In an embodiment, photolithographic patterning is done using a "conventional" positive or negative-tone photoresist material provided in a third layer over the first and second fluoropolymer layers. The term "conventional" in this context means that the photoresist material is provided from a composition that has one or more non-fluorinated organic solvent as a substantial component (e.g., making up at least 50% of the composition weight) or that its processing (e.g., development) requires aqueous or primarily non-fluorinated organic media. There may be some small amount of fluorination to the conventional "non-fluorinated" photoresist material, but not to a degree that they become substantially soluble in HFE or perfluorinated solvents. Such photoresist materials are well known in the art and some non-limiting examples include those based on poly(methyl methacrylate) (PMMA), poly(methyl glutarimide) (PMGI), phenol formaldehyde resins (DNQ/Novolac) and SU-8. Common photoresist suppliers include AZ Electronic Materials, Fujifilm Electronic Materials, Tokyo Ohka Kogyo Co., Shipley (Rohm & Haas), and MicroChem to name just a few. In an embodiment, the conventional photoresist further includes a fluorinated surfactant or other fluorinated material to improve wetting of the resist on underlying fluoropolymer layer. In an embodiment, the fluorinated surfactant is polymeric. Non-limiting examples of fluorosurfactants include Zonyl FSN (and similar materials from DuPont), Surflon S-386 (and similar materials from AGC Seimi Chemical), and FC-4432. (and similar materials from 3M). Such fluorinated surfactants or materials are typically added at a level less than 10% by weight relative to the photopolymer, alternatively less than 5% by weight relative to the photopolymer.

Alternatively, the photoresist may optionally be a fluorinated photoresist provided from a fluorinated coating solvent so long as the underlying base layer retains at least some of its structural integrity, i.e., it is not dissolved too quickly by the coating solvent. Although such fluorinated photoresists may be generally benign, an additional layer of separation from the photoactive layer of photoresist can in some embodiments provide extra protection.

A flow diagram for an embodiment of forming and using a two-layer lift-off structure is shown in FIG. 1, and in cross-sectional view in FIGS. 2A-2G. In step 301, a base layer 311 comprising a fluorinated material is formed over device substrate 310 having a first array of one or more active areas 310a. In the figure, the array includes two active areas, but the array could instead have just a single active area or more than two active areas. The device substrate further includes a sensitive area 310s that is sensitive to conventional lithographic processing or contaminants such as water or conventional (non-fluorinated) solvents. For example, sensitive area 310s may be part of a substrate layer comprising an active organic material.

The device substrate may be flexible or rigid, and may include a multilayer structure having various features, e.g., conductors, circuitry, dielectrics, semiconductors, optical layers and the like. One non-limiting example of such a device includes an OLED device, but the device may instead be an organic photovoltaic, an OTFT, a touch sensor, a chemical sensor, a bioelectronic or medical device. The device may be a conventional MEMS device or integrated circuit. The active areas could be electrodes, optical structures, test sample areas, target areas for deposition or etching or the like, depending on the nature of the device. The base layer may optionally undergo subsequent processing steps such as curing, drying, surface treatments or the like. In step 303 a photoresist layer 312 is formed over base layer 311 to form a precursor lift-off structure. In an embodiment, the base layer 311 protects sensitive area 310s from photoresist components (coating solvent, polymer, PAG or the like), which may otherwise seriously damage sensitive area 310s. The photoresist layer may undergo drying or other steps prior to step 305 wherein the photoresist layer 312 is exposed to patterned radiation by providing a radiation source 313 and an intervening photomask 314. This forms an exposed photoresist layer 315 having a pattern of exposed photoresist regions 316 and a complementary pattern of unexposed photoresist regions 317. In this case the photoresist is a negative tone type, but a positive tone could be used instead. Other methods of photopatterning may optionally be used, e.g., projection exposure, patterned laser exposure and the like.

Next, as shown in step 306, the exposed photoresist layer is developed with a developing agent (e.g., an aqueous, alkaline developer if using many conventional photoresists), which in this embodiment, removes unexposed photoresist regions 317 to form a patterned photoresist and a pattern of uncovered base layer 318. In an embodiment, the base layer protects the sensitive area 310s from the photoresist developing agent, which may otherwise seriously damage the sensitive area 310s. In step 307, the pattern of uncovered base layer is removed, for example, by using a base layer developing agent comprising a fluorinated solvent such as a hydrofluoroether or perfluorinated solvent, thereby forming lift-off structure 319 having a first pattern of openings 320 and a pattern of uncovered substrate 320A. The patterned photoresist acts as an etch mask for the base layer developing agent, which acts as an etch liquid for the fluorinated material layer. The base layer developing agent dissolves the fluorinated material layer at a first rate. The removal of the base layer forms an undercut region 321. If the first rate is too fast, it may be difficult to control the development and undercut profile. In an embodiment, the first rate is less than 500 nm/sec, or alternatively, in a range of 10 to 200 nm/sec, alternatively in a range of 15 to 100 nm/sec. In an embodiment, the base layer development time required to form the first pattern of open areas is at least 5 sec. In an embodiment, the base layer developing agent comprises a mixture of solvents. In an embodiment, the mixture includes a first and second fluorinated solvent. In an embodiment, the base layer developing agent includes a first-type of HFE solvent as a primary component. A first-type of HFE is a saturated, segregated hydrofluoroether having at least five perfluorinated carbon atoms and less than three hydrogen-containing carbon atoms. Some non-limiting examples of such first-type HFE solvents include HFE-7300. HFE-7500 and HFE-7700. In an embodiment, the base-layer developing agent includes a segregated hydrofluoroether having a boiling point of at least 90° C.

Figure 2A:
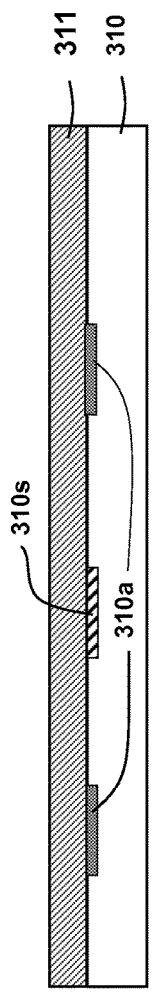
FIG. 2 is a series (2A-2G) of cross-sectional views depicting various stages in the formation of a patterned structure according to an embodiment of the present disclosure.
Figure 2B:
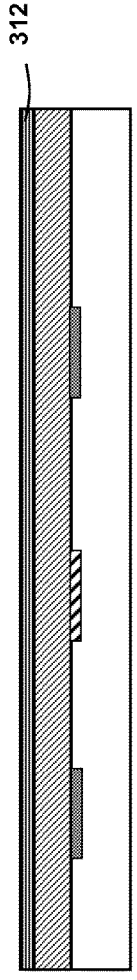
Figure 2C:
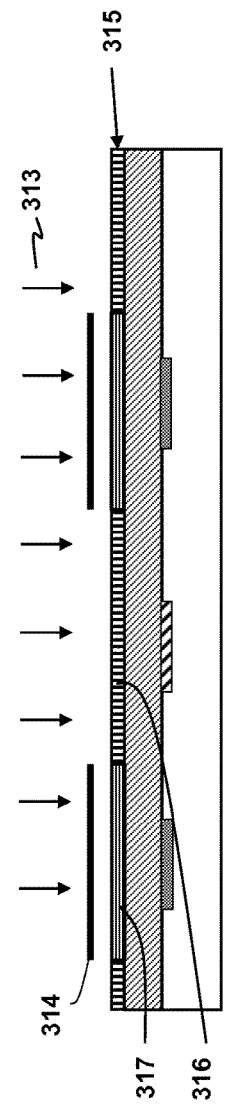
Figure 2D:
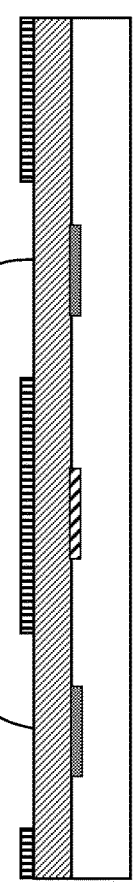
Figure 2E:
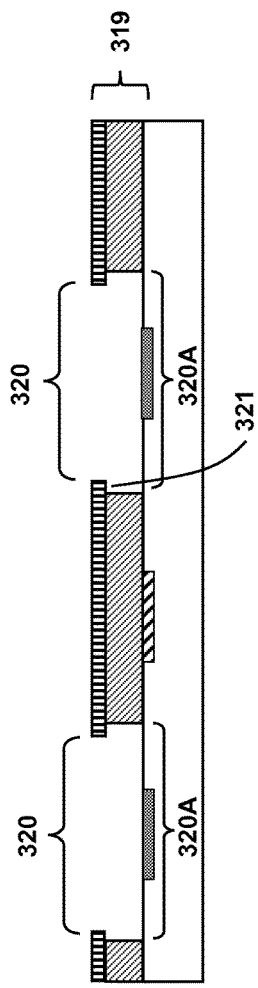

Not shown, the structure from FIG. 2E may optionally be subjected to a cleaning step to remove base layer (or other) residue from the uncovered active areas. This can be done using appropriate solvents, or preferably, using "dry etching" methods. Herein, the term "dry etchant" is used broadly and refers to any useful gaseous material possessing energy sufficient to clean a target area. Dry etching includes, but is not limited to, glow discharge methods (e.g., sputter etching and reactive ion etching), ion beam etching (e.g., ion milling, reactive ion beam etching, ion beam assisted chemical etching) and other "beam" methods (e.g., ECR etching and downstream etching), all of which are methods known in the art. Some common dry etchants include oxygen plasma, argon plasma, UV/ozone, $CF_4$ and $SF_6$, and various combinations. Alternatively a substantially non-oxidizing plasma may be used, e.g., one including hydrogen and a non-oxidizing gas such as nitrogen or helium.

In step 308, active material 346 (e.g., an active organic material, an electrically conductive material, a biological material, an optical material or the like) is deposited over the patterned photoresist (this portion labelled 346') and through the first pattern of openings onto at least a portion attic uncovered substrate and over the active areas 310a. Although not shown in the figures, rather than depositing a material, the uncovered substrate may instead be subjected to other treatments such as etching, doping, surface modification or the like. In an embodiment, the substrate may first undergo an etching step followed by deposition of an active material.

In step 309, the lift-off structure is removed by contact with a lift-off agent comprising a fluorinated solvent wherein the lift-off agent dissolves the fluorinated base layer material at a second rate that higher than the dissolution rate of the base layer developing agent, and preferably, the second dissolution rate is at least is at least 150 nm/sec. In an embodiment, the composition of the lift-off agent is substantially the same as that of the developing agent, but lift-off temperature conditions are changed. For example lift-off step may be conducted at a temperature that is at least 10° C. higher than contact with the developing agent.

In an embodiment, the contact with the developing agent is conducted at a temperature in a range of 15° C. to 25° C. and contact with the lift-off agent is conducted in a range of 35° C. to 65° C.

In an embodiment, the lift-off structure is removed by using a lift-off agent comprising a fluorinated solvent having a density greater than the effective density of the patterned resist layer plus any overlying active layers. In this context, "effective density" is the total mass of the resist layer plus any overlying layers divided by the volume of such resist layer and overlying layers. This simplifies removal of the photoresist layer (plus overlying layers) and encourages separation of such layers by enabling these layers to quickly rise to the top surface of a lift-off agent liquid. This can speed lift-off and also reduce the chance that possible debris from the lift-off materials will damage the remaining device structure. By concentrating such debris near the surface of the lift-off agent liquid, a processing machine can be designed to readily filter out the debris.

In an embodiment, the resist or upper portion of the lift-off structure is selected to have some residual stress that encourages the lift-off portion to curl during lift off. This curling action can more quickly expose fresh base layer thereby speeding up the lift-off step. In an embodiment, the curl force induces an arc of at least 180° in at least a portion of the lift-off structure. In an embodiment, the curl force induces an arc of at least 360° in at least a portion of the lift-off structure, i.e., at least a portion of the lift-off structure rolls up on itself.

In an embodiment the lift-off agent has a different composition than the base layer developing agent, and may optionally include a mixture of fluorinated solvents. In an embodiment, the lift-off agent includes a second-type FIFE as a primary component. In an embodiment, the second-type of hydrofluoroether solvent is saturated having fewer than four more perfluorinated carbon atoms than hydrogen-containing atoms. In an embodiment, the second-type hydrofluoroether solvent is a saturated segregated hydrofluoroether having less than five perfluorinated carbon atoms or it is a non-segregated hydrofluoroalkylether. The second-type of HFE solvent typically has a fluorine content of at least 50% by weight, preferably at least 60% by weight, but typically less than about 69%. Some non-limiting examples ofsecond-type HFE solvents include HFE-7100, HFE-7200, HFE-7600 and HFE-6512.

Dissolution of the base layer causes separation of the patterned photoresist and overlying active material to form a patterned structure 350 including unharmed sensitive area 310s and patterned active material 346 provided over active areas 310a. Optionally, patterned structure 350 may be contacted with a cleaning agent having a chemical composition different from the lift-off agent, the cleaning agent including a fluorinated solvent. For example, the cleaning agent may include a fluorinated solvent and a protic solvent such as an alcohol (e.g. IPA) at 15% or less by volume, alternatively 5% or less by volume. Alternatively, the protic solvent may include an organic acid at 5% or less by weight or alternatively 1% or less by weight. Such treatment can be used to remove very small amounts of residue left behind by the process.

In an alternative embodiment (not shown), rather than depositing active material 346 or prior to depositing active material 346, the device substrate may be patterned by subjecting it to an etching step that removes a portion of at least the first array of active areas, wherein the lift-off structures act as etch masks. Etching can be done by dry etching or chemical etching (by contact with an etch liquid). Dry etching includes, but is not limited to, glow discharge methods (e.g., sputter etching and reactive ion etching), ion beam etching (e.g., ion milling, reactive ion beam etching, ion beam assisted chemical etching)) and other "beam" methods (e.g., ECR etching and downstream etching), all of which are methods known in the art. Some common dry etchants include oxygen plasma, argon plasma, UV/ozone, $CF_4$ and $SF_6$, and various combinations. Chemical etching depends upon the nature of the substrate, but in any event, the etch liquid should dissolve at least a portion of the first array of active areas, but not substantially dissolve the lift-off structure.

Referring again to FIG. 2F, while he thickness of the lift-off structure(s) may be only a few microns, the distance between active areas can be tens or hundreds of microns or more (as mentioned, the figures are not drawn to scale). Thus, the time it takes to remove the lift-off structure (lift-off time) can be prohibitive if using the same composition as the developing agent, which in the present disclosure, is deliberately designed to be relatively slow in order to control the undercut profile. In an embodiment, the second rate is at least 150 nm/sec. In an embodiment, the second rate is at least 200 nm/sec, or alternatively, at least 300 nm/sec. In an embodiment the second rate is at least 3 times higher than the first rate, or alternatively, at least 5 times higher than the first rate, or alternatively, at least 10 times higher.

In an embodiment, the developing agent comprises a mixture of first and second fluorinated solvents and the lift-off agent comprises at least one of the first and second fluorinated solvents at a different concentration than in the developing agent. Alternatively, the lift-off agent comprises a mixture of first and second fluorinated solvents, and the developing agent comprises at least one of the first and second fluorinated solvents. Using at least one common solvent between the developing agent and the lift-off agent can result in improved recycling, e.g., as disclosed in U.S. patent application Ser. No. 14/260,666, which is incorporated by reference.

In embodiments described herein, a fluorinated photoresist or a fluorinated base layer may be coated or processed (e.g., development or lift-off) using a fluorinated solvent. Particularly useful fluorinated solvents include those that are perfluorinated or highly fluorinated liquids at room temperature, which are immiscible with water and many organic solvents. Among those solvents, hydrofluoroethers (HFEs) are well known to be highly environmentally friendly, "green" solvents. HFEs, are preferred solvents because they are non-flammable, have zero ozone-depletion potential, lower global warming potential than PFCs and show very low toxicity to humans.

Two classes of HFEs include: (a) segregated hydrofluoroethers, wherein ether-bonded segments (e.g. alkyl segments) of the HFE are either perfluorinated (e.g., a perfluorocarbon segment) or non-fluorinated (e.g., a hydrocarbon segment), but not partially fluorinated; and (b) non-segregated ITFEs, wherein one or both ether-bonded segments are partially fluorinated. In an embodiment, the segments do not include any double bonds (i.e., they are saturated). To be generally useful in the present disclosure, HFEs should have a fluorine content that is at least 50% by weight, preferably at least 60% by weight, in order to properly solubilize the fluoropolymer(s) of the present disclosure. Some HFEs may have multiple ether units or include saturated nitrogen atoms.

Examples of readily available HFEs and isomeric mixtures of HFEs include, but are not limited to, an isomeric mixture of methyl nonafluorobutyl ether and methyl nonafluoroisobutyl ether (HFE-7100 aka Novec™ 7100), an isomeric mixture of ethyl nonafluorobutyl ether and ethyl nonafluoroisobutyl ether (HFE-7200 aka. Novec™ 7200), 3-ethoxy-1,1,1,2,3,4,4,5,5,6,6,6-dodecafluoro-2-trifluoromethyl-hexane (HFE-7500 aka Novec™ 7500), 1,1,1,2,3,3-hexafluoro-4-(1,1,2,3,3,3,-hexafluoropropoxy)-pentane (HFE-7600 aka PF7600 (from 3M)), 1-methoxyheptafluoropropane (HFE-7000), 1,1,1,2,2,3,4,5,5,5-decafluoro-3-methoxy-4-trifluoromethylpentane (HFE-7300 aka Novec™ 7300), 1,2-(1,1,2,2-tetrafluoroethoxy)ethane (HFE-578E), 1,1,2,2-tetrafluoroethyl-1H,1H,5H-octafluoropentyl ether (HFE-6512), 1,1,2,2-tetrafluoroethyl-2,2,2-trifluoroethyl ether (HFE-347E), 1,1,2,2-tetrafluoroethyl-2,2,3,3-tetrafluoropropyl ether (HFE-458E), 2,3,3,4,4-pentafluorotetrahydro-5-methoxy-2,5-bis[1,2,2,2-tetrafluoro-1-(trifluoromethyl)ethyl]-furan (HFE-7700 aka Novec™ 7700) and 1,1,1,3,4,4,5,5,6,6-tridecafluorooctane-propyl ether (TE60-C3).

In the above list, segregated HFEs include HFE-7100, HFE-7200, HFE-7300, HFE-7500 and HFE-7700. Some additional, non-limiting examples of segregated HFEs include $F(CF_2)_5OCH_3$, $F(CF_2)_6OCH_3$, $F(CF_2)_7OCH_3$, $F(CF_2)_8OCH_2CH_2CH_3$, $F(CF_2)_2O(CF_2)_4OCH_2CH_3$, $F(CF_2)_3OCF(CF_3)CF_2OCH_3$, $(CF_3)_2N(CF_2)_3OCH_3$, $(C_3F_7)_2N(CF_2)_3OC_3H_7$,

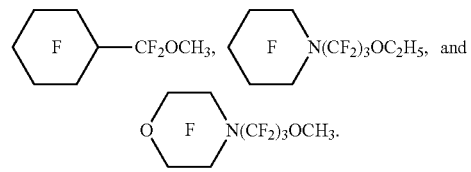

Boiling points of HFEs in the present disclosure typically range from about 50° C. to 200° C.

Fluorinated Material Layer

In an embodiment, the fluorinated material layer includes a fluorinated polymer having a total fluorine content of at least 35% by weight, or alternatively, at least 45% by weight. In an embodiment, the fluorinated polymer is a copolymer comprising at least two distinct repeating units including a first repeating unit having a fluorine-containing group and a second repeating unit having a functional group, wherein the copolymer has a total fluorine content of at least 45% by weight. Incorporation of functional groups other than fluorine-containing groups can be helpful to tailor the solubility of the fluorinated material in the desired developing agent and lift-off agent. Functional groups may also improve the coatability of compositions comprising the fluorinated copolymer over a device substrate and the coatability of layers that may be provided over the fluorinated material layer.

In an embodiment, one or more of the repeating units of the copolymer may be formed via a post-polymerization reaction. In this embodiment, an intermediate polymer (a precursor to the desired copolymer) is first prepared, said intermediate polymer comprising suitably reactive functional groups for forming one of more of the specified repeat units. For example, an intermediate polymer containing pendant carboxylic acid moieties be reacted with a fluorinated alcohol compound in an esterification reaction to produce the specified fluorinated repeating unit. Similarly, a precursor polymer containing an alcohol can be reacted with a suitably derivatized aliphatic hydrocarbon group to form an aliphatic hydrocarbon functional groups. In another example, a polymer containing a suitable leaving group such as primary halide can he reacted with an appropriate compound bearing a phenol moiety to form the desired repeat unit via an etherification reaction. In addition to simple condensation reactions such as esterification and amidation, and simple displacement reactions such as etherification, a variety of other covalent-bond forming reactions well-known to practitioners skilled in the art of organic synthesis can be used to form any of the specified repeat units. Examples include palladium-catalyzed coupling reactions, "click" reactions, addition to multiple bond reactions, Wittig reactions, reactions of acid halides with suitable nucleophiles, and the like.

In an alternative embodiment, the repeating units are formed by polymerization of two (or more) appropriate monomers each having a polymerizable group, rather than by attachment to an intermediate polymer. The polymerizable group may, for example, be polymerized by step-growth polymerization using appropriate functional groups or by a chain polymerization such as radical polymerization. Some non-limiting examples of useful radical polymerizable groups include acrylates (e.g. acrylate, methacrylate, cyanoacrylate and the like), acrylamides, vinylenes (e.g., styrenes), vinyl ethers and vinyl esters. Although many of the embodiments below refer to polymerizable monomers, analogous structures and ranges are contemplated and within the scope of the present disclosure wherein one or more of the repeating units are formed instead by attachment to an intermediate polymer, by step-growth polymerization or other means.

In an embodiment, the fluorinated copolymer material includes a copolymer formed at least from a first monomer having a fluorine-containing group and a second monomer having a functional group.

The fluorine-containing group of the first monomer or the first repeating unit is preferably an alkyl or aryl group that may optionally be further substituted with chemical moieties other than fluorine, e.g., chlorine, a cyano group, or a substituted or unsubstituted alkyl, alkoxy, alkyithio, aryl, aryloxy, amino, alkanoate, benzoate, alkyl ester, aryl ester, alkanone, sulfonamide or monovalent heterocyclic group, or any other substituent that a skilled worker would readily contemplate that would not adversely affect the performance of the fluorinated photopolymer. Throughout this disclosure, unless otherwise specified, any use of the term all includes straight-chain, branched and cyclo alkyls. In an embodiment, the first monomer does not contain protic or charged substituents, such as hydroxy, carboxylic acid, sulfonic acid or the like.

In an embodiment, the first monomer has a structure according to formula (1):

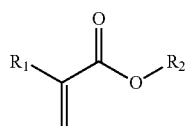

(1)

In formula (1), $R_1$ represents a hydrogen atom, a cyano group, a methyl group or an ethyl group. $R_2$ represents a fluorine-containing group, for example, a substituted or unsubstituted alkyl group having at least 5 fluorine atoms, preferably at least 10 fluorine atoms. In an embodiment, the alkyl group is a hydrofluorocarbon or hydrofluoroether having at least as many fluorine atoms as carbon atoms. In a preferred embodiment $R_2$ represents a perfluorinated alkyl or a 1H,1H,2H,2H-perfluorinated alkyl having at least 4 carbon atoms. An example of the latter would be 1H,1H,2H,2H-perfluorooctyl (aka 2-perfluorohexyl ethyl), and a particularly useful first monomer includes 1H,1H,2H,2H-perfluorooctyl methacrylate ("FOMA") and similar materials.

Some non-limiting examples of polymerizable monomers having a fluorine-containing group include the following.

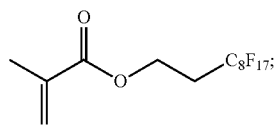

F-1

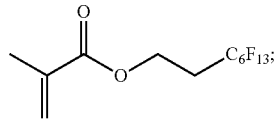

F-2

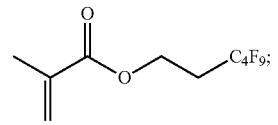

F-3

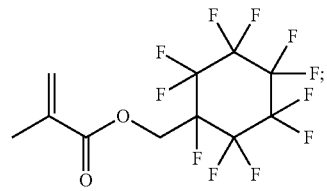

F-4

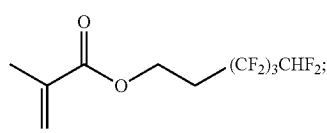

F-5

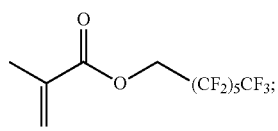

F-6

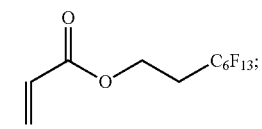

F-6

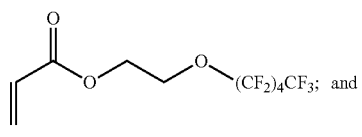

F-7

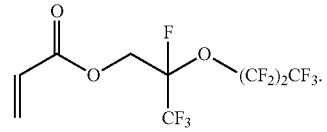

F-8

Multiple "first repeating units" or "first monomers" may be used in the copolymer, i.e., the copolymer may include more than just one type of fluorine-containing group or fluorine-containing first monomer.

The second monomer is one capable of being copolymerized with the first monomers. The second monomer includes a polymerizable group and a functional group as described below. Functional groups generally do not include substantial amounts of fluorine substituents, i.e., they include 3 fluorine atoms or fewer. In an embodiment, the functional groups are not fluorinated. In an embodiment the functional group is not a photochemically activated solubility-altering reactive group. That is, the fluoropolymer is not photoactive, but rather, it is stable when exposed to radiation having a wavelength of 365 nm or above and not directly photopatternable.

In an embodiment, the functional group includes a silane or siloxane. Some non-limiting examples of polymerizable monomers incorporating such functional groups are shown below.

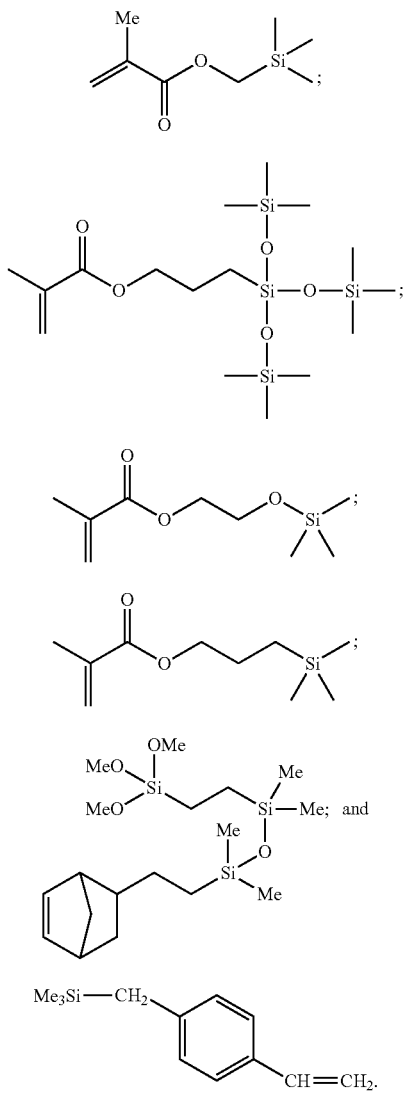

SI-1

SI-2

SI-3

SI-4

SI-5

SI-6

In an embodiment, the functional group includes an aromatic hydrocarbon that does not include a protic substituent, but may optionally include an alkyl group, an ether group, an ester groups or a ketone group. Some examples of polymerizable monomers incorporating such functional groups are shown below.

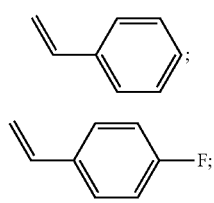

AR-1

AR-2

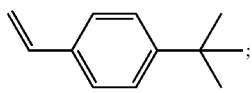

AR-3

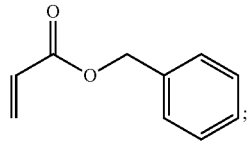

AR-4

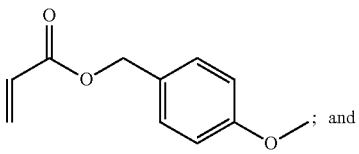

AR-5

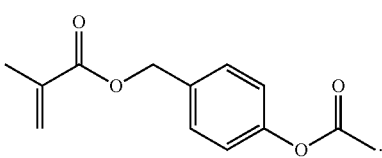

AR-6

In an embodiment, the functional group includes a cyclic or non-cyclic aliphatic hydrocarbon that does not include a protic substituent. The aliphatic hydrocarbon functional group may optionally include non-protic substituents including, but not limited to, ether groups, ester groups, and ketone groups. In an embodiment, the aliphatic hydrocarbon functional group does not include any fluorine substituents. In an embodiment, the copolymer comprising an aliphatic hydrocarbon functional group has a total fluorine content in a range of 46 to 53% by weight. Some non-limiting examples of polymerizable monomers incorporating such functional groups are shown below.

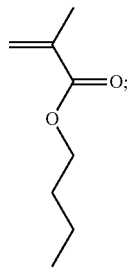

AL-1

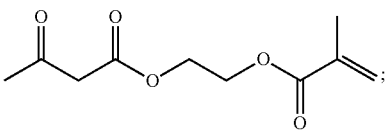

AL-2

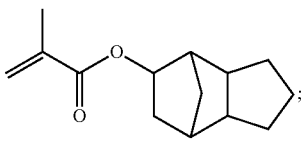

AL-3

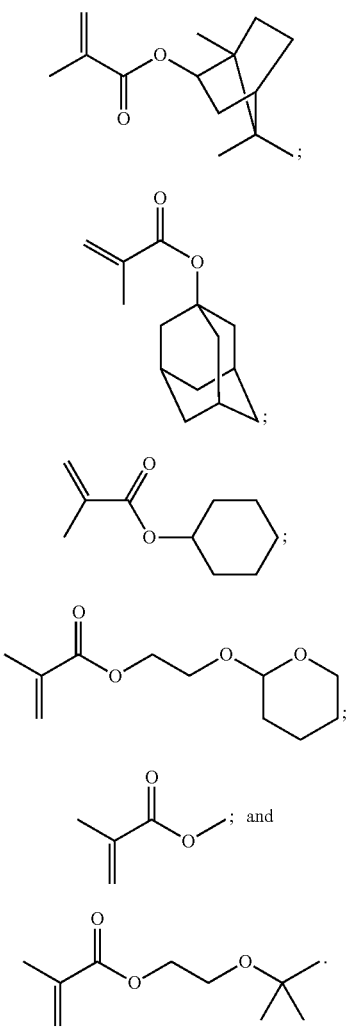

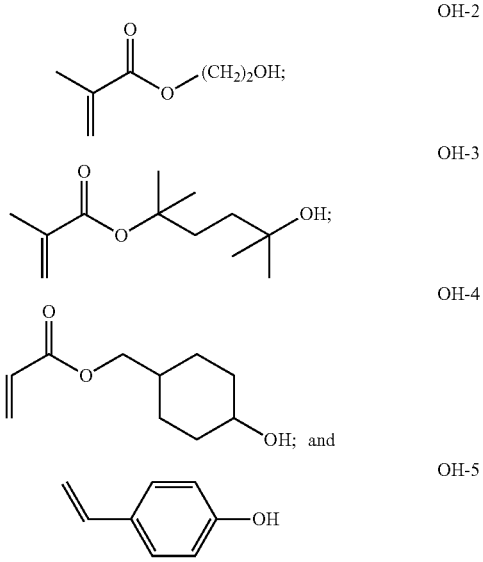

In an embodiment, the functional group includes a protic substituent including, but not limited to alcohol groups, carboxylic acid groups, primary or secondary amine groups, and sulfonic acid groups. In an embodiment, when a functional group includes a protic substituent the copolymer has a total fluorine content of more than 50% by weight.

In an embodiment, the functional group is an alcohol group and the copolymer has a total fluorine content of at least 55% by weight. Alternatively, or in addition, the functional group is an alcohol group and the copolymer has a total hydroxyl group content of less than 1.0% by weight, preferably less than 0.5% by weight. Hydroxyl group content refers to the mass of OH substituents of the alcohol (each having a formula weight of 17 daltons) relative to total mass of the copolymer. Some non-limiting examples of polymerizable monomers incorporating such functional groups are shown below.

In an embodiment, the functional group is carboxylic acid group and the copolymer has a total fluorine content of at least 56% by weight. Alternatively, or in addition, the functional group is a carboxylic acid group and the copolymer has a total hydroxyl group content of less than 0.5% by weight, preferably less than 0.25% by weight. Hydroxyl group content refers to the mass of OH portion of the carboxylic acid substituents (each having a formula weight of 17 daltons) relative to total mass of the copolymer. Some non-limiting examples of polymerizable monomers incorporating such functional groups are shown below.

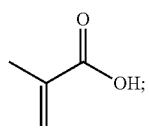

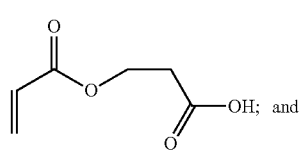

In an embodiment, copolymer having mixtures of different functional groups may also be used.

Methods for preparing polymers from monomers are generally known in the art. Fluorinated copolymers of the present disclosure may be prepared by dissolving the desired monomers in a reaction solvent such as trifluorotoluene (typically degassed with nitrogen or argon) along with a small amount of a radical initiator such as AIBN or similar material. Typically the reaction mixture is heated, e.g., to above 60° C. for several hours. After cooling to ambient temperature, the copolymer may be precipitated, e.g., in cold methanol, filtered, and then re-dissolved in a target coating solvent, typically a fluorinated solvent such as a hydrofluoroether having a boiling point greater than 90° C. A typical concentration of copolymer for coating is in a range of 8% to 25% by weight of copolymer solids, depending on target coating thickness, solution viscosity and other factors known in the art.

OLED Structures

Many different types of OLED device structures have been developed over the years. Essentially, an OLED device includes at a minimum an anode for injecting holes, a cathode for injecting electrons and an organic EL medium sandwiched between the electrodes wherein the holes and electrons combine to produce light emission. OLED devices are often provided on a substrate. The electrode adjacent to a substrate is typically referred to as the first or bottom electrode. The electrode spaced away from the substrate by the organic EL medium is typically referred to as the second or top electrode. A common structure ("standard structure") includes an anode as the bottom electrode provided on a substrate with subsequent organic layers deposited over the anode and finally a cathode deposited over the organic layers to form the top electrode. An "inverted structure" is just the reverse and has a cathode as the bottom electrode provided on a substrate with subsequent organic layers deposited over the cathode and finally an anode deposited over the organic layers to form a top electrode. A "bottom-emitting" OLED typically includes a transparent or translucent bottom electrode and a reflective or light absorbing top electrode structure. That is, light is directed through the device substrate. A "top-emitting" OLED includes a transparent or translucent top electrode and a reflective or light absorbing bottom electrode structure. That is, light is directed away from the device substrate. A "transparent" OLED has transparent or translucent top and bottom electrodes.

Figure 3:
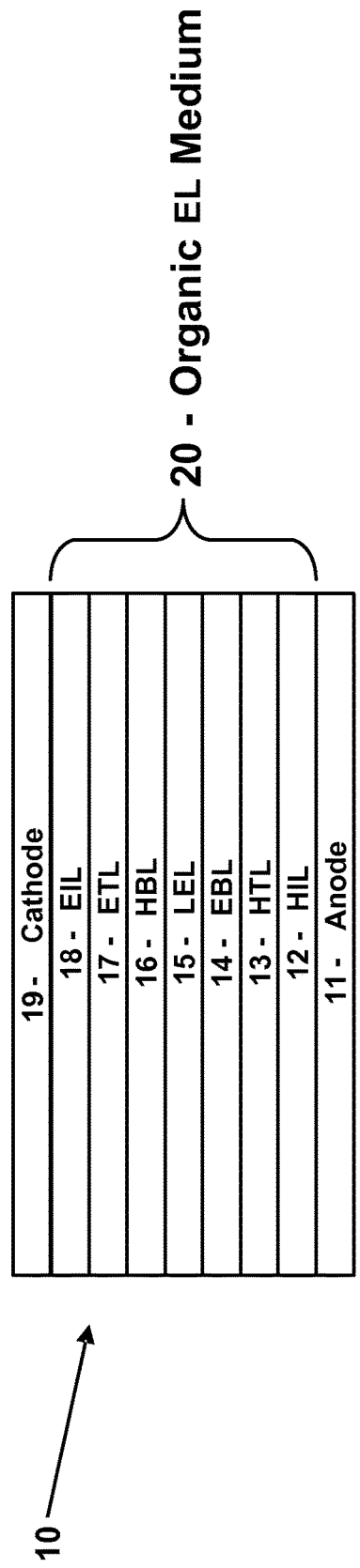
FIG. 3 is cross sectional view of a representative OLED device.

A non-limiting example of an OLED device 10 is shown in FIG. 3 and includes anode 11, hole-injecting layer (HIL) 12, hole-transporting layer (HTL) 13, electron-blocking layer (EBL) 14, light-emitting layer (LEL) 15 (sometimes referred to in the art as an emissive layer or EML), hole-blocking layer (HBL) 16, electron-transporting layer (ETL) 17, electron-injecting layer (EIL) 18 and cathode 19. The layers between the anode and cathode are often collectively referred to as the organic EL medium 20. There are many other OLED layer architectures known in the art having fewer or additional layers and there can be overlap in layer functionality. For example, if an EBL is used, it typically also has hole-transporting properties in addition to electron-blocking properties. An HBL, if used, typically has electron-transporting properties. The LEL might have predominantly hole-transporting or electron-transporting properties, or it might have both. There can be multiple light emitting layers. So-called "tandem" architecture is known that includes one or more charge separation layers between light-emitting stacks that can double current efficiency.

Some non-limiting examples of materials useful for OLED devices are discussed below. Although the emphasis is on organic EL medium materials that can be vapor deposited, certain embodiments of the present disclosure may instead use solution deposited OLED materials. A few non-limiting examples of OLED material and structures can be found in U.S. Pat. Nos. 8,106,582 and 7,955,719, the entire contents of which are incorporated by reference.

When EL emission is viewed through the anode, the anode should be substantially transparent to the emission of interest. The term "transparent" herein means that at least 30% of emitted light is transmitted, preferably at least 50%. Common transparent anode materials used in the present disclosure are indium-tin oxide (ITO), indium-zinc oxide (IZO), and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and many conductive materials can be used, regardless if transparent, opaque, or reflective. Example conductors for the present disclosure include, but are not limited to, gold, iridium, molybdenum, palladium, and platinum. Unless unique HIL materials are used, typical anode materials have a work function of at least 4.0 eV.

If EL emission is viewed through the cathode, it must be transparent or nearly transparent. For such applications, metals must be thin (preferably less than 25 nm) or one may use transparent conductive oxides (e.g. indium-tin oxide, indium-zinc oxide), or a combination of these materials. Some non-limiting examples of optically transparent cathodes have been described in more detail in U.S. Pat. No. 5,776,623, if EL emission is not viewed through the cathode, any conductive material known to be useful in OLED devices may be selected, including metals such as aluminum, molybdenum, gold, iridium, silver, magnesium, the above transparent conductive oxides, or combinations of these. Desirable materials promote electron injection at low voltage and have effective stability. Useful cathode materials often contain a low work function metal (<4.0 eV) or metal alloy. Cathode materials can be deposited, for example, by evaporation, sputtering, or chemical vapor deposition.

The HIL can be formed of a single material or a mixture of materials. The hole-injecting layer may be divided into several layers having different composition. The hole-injecting material can serve to improve the film formation property of subsequent organic layers and to facilitate injection of holes into the hole-transporting layer. Suitable materials for use in the hole-injecting layer include, but are not limited to porphyrin and phthalocyanine compounds as described in U.S. Pat. No. 4,720,432, thiophene-containing compounds, phosphazine compounds, and certain aromatic amine compounds. The HIL may include an inorganic compound such as a metal oxide (e.g., molybdenum oxide), metal nitride, metal carbide, a complex of a metal ion and organic ligands, and a complex of a transition metal ion and organic ligands. Suitable materials for use in the hole-injecting layer may include plasma-deposited fluorocarbon polymers (CFx) as described in U.S. Pat. No. 6,208,075, certain hexaazatriphenylene derivatives as described in U.S. Pat. No. 6,720,573 B2 (e.g. hexacyanohexaazatriphenylene) or tetracyarioquinone derivatives such as F4TCNQ. The hole-injecting layer can also be composed of two components: for example, an aromatic amine compound, doped with a strong oxidizing agent, such as dipyrazino[2,3-f:2',3'-h]quinoxalinehexacarbonitrile, F4TCNQ, or FeCl3.

The HTL can be formed of a single or a mixture of organic or inorganic materials and may be divided into several layers. The hole-transporting layer most commonly includes a tertiary aryl amine, e.g., a benzidine or a carbazole, but instead (or in addition) may comprise a thiophene, or other electron-rich material. EBL materials (if used) are generally selected from the same group as HTL materials and have an electron conduction band significantly higher in energy (more difficult to reduce) than the overlying LEL thereby creating a barrier to further electron transport.

The LEL commonly includes a host material and a light-emitting dopant. Injected holes and electrons recombine in the LEL. Hosts include HTL materials, ETL materials, a mixture of HTL and ETL materials or ambipolar materials readily capable of transporting holes and electrons. Examples of common hosts for singlet emission include polycyclic aromatic compounds such as anthracene derivatives. Examples of common hosts for triplet emission include carbazole compounds and aromatic amines. A wide variety of light-emitting dopants are known and are used to provide the desired emission wavelength by harvesting excitons created from the electron/hole charge injection. Many common singlet emitting dopants are aromatic organic compounds whereas many common triplet emitting dopants are metal complexes of iridium or platinum.

The ETL can be formed of a single or a mixture of organic or inorganic materials and may be divided into several layers. Common ETL materials include metal oxine chelates such as Alq, phenanthroline derivatives such as BCP, triazines, benzimidazoles, triazoles, oxadiazoles, silane compounds such as silacyclopentadiene derivatives, and borane derivatives. HBL materials (if used) are generally selected from the same group as ETL materials and have hole conduction band significantly lower in energy (more difficult to oxidize) than the underlying LEL thereby creating a barrier to further hole transport.

The EIL may include an ETL material plus a reducing dopant at or near the interface between the cathode and ETL. The reducing dopant can be organic, inorganic, or metal complexes. Common reducing dopants include alkali metals such as Cs or combinations of alkali metals. The EIL, may include an alkali or alkaline metal complex, salt or oxide (e.g., lithium quinolate, LiF, CaO) that forms a reducing dopant upon deposition of a cathode material such as aluminum.

OLED Deposition

There are many ways to deposit organic EL medium materials onto a substrate including, but not limited to, solution coating, vapor deposition, and transfer from a donor sheet. In certain embodiments of the present disclosure at least some of the organic OLED layers be deposited by vapor deposition means, e.g., physical vapor deposition in a reduced pressure environment. In some embodiments, most or all of the organic EL medium layers are provided by vapor deposition.

Many types of vapor deposition equipment are suitable. Such equipment may use point sources, linear sources, vapor-injection sources, carrier gas-assisted sources (OVPD) and the like. In some embodiments, the vapor plume is preferably highly directional to achieve a controlled line-of-site deposition through a patterned photoresist structure as will be shown later.

OLED Devices/Backplanes

There is no particular limitation on the type of OLED device that may be fabricated based on methods of the present disclosure, so long as some patterning is intended. The present methods are especially directed to full color OLED displays such as active matrix OLED (AMOLED) and passive matrix OLED (PMOLED), but the methods may be used to prepare OLED lighting and signage. OLED device substrates may be rigid or flexible. Support materials include, but are not limited to, glass, polymers, ceramics and metals, and composites or laminates thereof.

AMOLED backplanes typically include an array of independently addressable first (bottom) electrodes that are connected to thin film transistor (TFT) circuitry provided over a substrate typically in a multilayer structure. The TFT may be based on Si, metal oxide or organic semiconductors (OTFT). In addition to the semiconductors, dielectrics and conductors are used to prepare structures that form the transistors, capacitors, wiring . . . etc. as is known in the art.

Representative Embodiments

Below are some non-limiting, representative embodiments of the present disclosure.

1. A method of making a device comprising:
   a) providing a device substrate having one or more target areas for patterning;
   b) providing a fluorinated material layer over the device substrate;
   c) forming one or more lift-off structures at least in part by developing a first pattern of one or more open areas in the fluorinated material layer in alignment with the one or more target areas by contact with a developing agent comprising a fluorinated solvent, wherein the developing agent dissolves the fluorinated material at a first rate;
   d) patterning the device substrate by
      i) etching at least a portion of the one or more target areas using the one or more lift-off structures as an etch mask,
      ii) depositing one or more active material layers through the first pattern of open areas and onto the one or more target areas, or
      both i) and ii); and
   c) removing the one or more lift-off structures by contact a lift-off agent comprising a fluorinated solvent wherein the lift-off agent dissolves the fluorinated material at a second rate that is at least 150 nm/sec and higher than the first rate.

2. The method of embodiment 1 wherein contact with the lift-off agent is conducted at a temperature that is at least 10° C., higher than contact with the developing agent.

3. The method of embodiment 1 or 2 wherein contact with the developing agent is conducted at a temperature in a range of 15° C. to 25° C. and contact with the lift-off agent is conducted in a range of 35° C. to 65° C.

4. The method according to any of embodiments 1-3 wherein the composition of the lift-off agent includes a different fluorinated solvent than the developing agent.

5. The method according to any of embodiments 1-4 wherein the developing agent comprises a mixture of first and second fluorinated solvents and the lift-off agent comprises at least one of the first and second fluorinated solvents at a different concentration than in the developing agent.

6. The method according to any of embodiments 1-4 wherein the lift-off agent comprises a mixture of first and second fluorinated solvents and the developing agent comprises at least one of the first and second fluorinated solvents at a different concentration than in the lift-off agent.

7. The method according to any of embodiments 1-6 wherein the fluorinated material layer includes a copolymer comprising at least two distinct repeating units including a first repeating unit having a fluorine-containing group and a second repeating unit having a non-photoactive functional group that does not include a protic substituent, wherein the copolymer has a total fluorine content of at least 45% by weight.

8. The method according to embodiment 7 wherein the functional group includes an aliphatic hydrocarbon that does not include a protic substituent.

9. The method according to embodiment 8 wherein the copolymer has a total fluorine content a range of 46 to 53% by weight.

10. The method according to embodiment 7 wherein the functional group includes an aromatic hydrocarbon that does not include a protic substituent.

11. The method according lo any of embodiments 1-10 wherein the fluorinated material layer is substantially not directly photopatternable by exposure to radiation having a wavelength of 365 nm or above and an exposure dose of less than 1 J/cm$^2$.

12. The method according to any of embodiments 1-11 wherein the one or more lift-off structures further includes a patterned resist provided over the fluorinated material layer, wherein the patterned resist acts as an etch mask for the developing of the first pattern of open areas in the fluorinated material layer.

13. The method according to embodiment 12 wherein the patterned resist is provided by printing a resist material.

14. The method according to embodiment 13 wherein the printing includes ink jet printing, flexographic printing, gravure printing, screen printing, electrophotographic printing, or laser or thermal transfer of the resist material from a donor sheet.

15. The method according to embodiment 12 wherein the patterned resist is provided by photoimaging a photoresist material.

16. The method according to embodiment 15 wherein the photoresist material is provided from a composition comprising a non-fluorinated solvent.

17. The method according to embodiment 16 wherein the non-fluorinated solvent is water or an alcohol.

18. The method according to embodiment 16 wherein the non-fluorinated solvent is a non-protic, non-aromatic organic solvent having an ether group, an ester group, a ketone group or a combination thereof, or a non-erotic aromatic organic solvent.

19. The method according to embodiment 15 wherein the photoresist material is a fluorinated photoresist material provided from a composition comprising a fluorinated solvent selected not to dissolve a substantial portion of the underlying fluorinated material layer.

20. The method according to any of embodiments 1-19 wherein the deposition of the one or more active material layers includes vapor deposition.

21. The method according to any of embodiments 1-19 wherein the deposition of the one or more active material layers includes deposition from a liquid comprising at least one of the active materials.

22. The method according to any of embodiments 1-21 wherein the one or more lift-off structures has a thickness in a range of 0.2 to 5.0 µm.

23. The method according to any of embodiments 1-22 wherein the active material is an active organic material.

24. The method according to any of embodiments 1-23 wherein the device is an OLED device, an OTFT device, a photovoltaic device, a bioelectronic device or a medical device.

25. The method according to any of embodiments 1-24 wherein the substrate comprises a substrate layer having an active organic material and at least one lift-off structure covers at least a portion of the substrate layer having the active organic material.

26. A photoresist system comprising:
a) a fluorinated material composition comprising a hydrofluoroether coating solvent and a fluorinated copolymer that is not perfluorinated comprising at least two distinct repeating units including a first repeating unit having a fluorine-containing alkyl group and a second repeating unit having a non-photoactive functional group that does not include a protic substituent, wherein the copolymer has a total fluorine content of at least 45% by weight; and
b) a photoresist composition comprising a non-fluorinated organic solvent and a photosensitive polymer.

27. The system of embodiment 26 wherein the copolymer wherein the non-photoactive functional group is an aliphatic hydrocarbon and the copolymer has a total fluorine content in a range of 46 to 53% by weight.

28. The system of embodiment 26 or 27 wherein the copolymer is a random copolymer formed from monomers capable of undergoing radical polymerization, at least one which containing a vinyl, vinyl ether, actylate or methacrylate group.

29. The system according to any of embodiments 26-28 further comprising a fluorinated material developing agent comprising a first hydrofluoroether that is a saturated, segregated hydrofluoroether having at least five perfluorinated carbon atoms and less than three hydrogen-containing carbon atoms.

30. The system according to embodiment 29 wherein the first hydrofluoroether has a boiling point of at least 90° C.

31. The system according to any of embodiments 26-30 further comprising a lift-off agent comprising a second hydrofluoroether that is either a saturated segregated hydrofluoroether having less than five perfluorinated carbon atoms or it is a non-segregated hydrofluoroalkylether.

32. The system of embodiment 31 wherein a layer of the fluorinated material has a room temperature dissolution rate in the lift-off agent that is at least 200 nm/sec and at least five times higher than a room temperature dissolution rate of a layer of the fluorinated material in the developing agent.

33. The system according to any of embodiments 29-32 further comprising a cleaning agent having a composition different from the developing agent or the lift-off agent, wherein the cleaning agent includes a third hydrofluoroether.

34. The system of embodiment 33 wherein the cleaning agent further includes a prolic solvent.

EXAMPLES

Various fluorinated copolymers were prepared and their dissolution rates were measured in different hydrofluoroether solvents as models for the base layer developing agent and lift-off agent. Films were prepared by spin coating a target film on a silicon wafer followed by a post-apply bake at 90° C. for 1 min. Typical film thicknesses were 2 to 3 µm for this test. The rates were determined by measuring film thickness as a function of solvent contact lime using a Filmetrics F20 Thin Film Analyzer. This can be done either in situ or by applying the solvent of interest for set periods of time, spin drying and measuring the dry film. Rates greater than about 1000 nm/sec were generally too fast to measure accurately. Unless otherwise noted, all dissolution rates were conducted at room temperature, i.e., about 22° C.

Table 1 shows the rates for HFE-7100 (model lift-off agent) and HFE-7300 (model developing agent) wherein the copolymer included various amounts of a non-photoactive aliphatic hydrocarbon functional group. Table 1 further includes the total fluorine content (% by weight) of the copolymer.

TABLE 1

| Sample Number | % F by weight | Dissolution Rate in HFE 7100 (nm/sec) | Dissolution Rate in HFE 7300 (nm/sec) |
|---|---|---|---|
| 1 | 54.0 | >1000 | >1000 |
| 2 | 52.3 | >1000 | 300 |
| 3 | 50.6 | 1000 | 120 |
| 4 | 48.7 | 900 | 40 |
| 5 | 46.8 | 150 | 30 |

Table 2 shows the rates for HFE-7100 (model lift-off agent) and HFE-7300 (model developing agent) wherein the copolymer included various amounts of an alcohol containing functional group. Table 2 further includes the total fluorine content and hydroxyl content (% by weight) of the copolymer.

TABLE 2

| Sample Number | % F by weight | % OH by weight | Dissolution Rate in HFE 7100 (nm/sec) | Dissolution Rate in HFE 7300 (nm/sec) |
|---|---|---|---|---|
| 6 | 56.2 | 0.20 | 270 | 156 |
| 7 | 55.3 | 0.42 | 260 | 37 |
| 8 | 54.2 | 0.66 | 34 | 20 |

Table 3 shows the rates for HFE-7100 (model lift-off agent) and HFE-7300 (model developing agent) wherein the copolymer included various amounts of a carboxylic acid containing functional group. Table 3 further includes the total fluorine content and hydroxyl content (% by weight) of the copolymer.

TABLE 3

| Sample Number | % F by weight | % OH by weight | Dissolution Rate in HFE 7100 (nm/sec) | Dissolution Rate in HFE 7300 (nm/sec) |
|---|---|---|---|---|
| 9 | 56.5 | 0.20 | 260 | 75 |
| 10 | 55.9 | 0.42 | 36 | Not measured |

Lift-Off Structure

Figure 4:
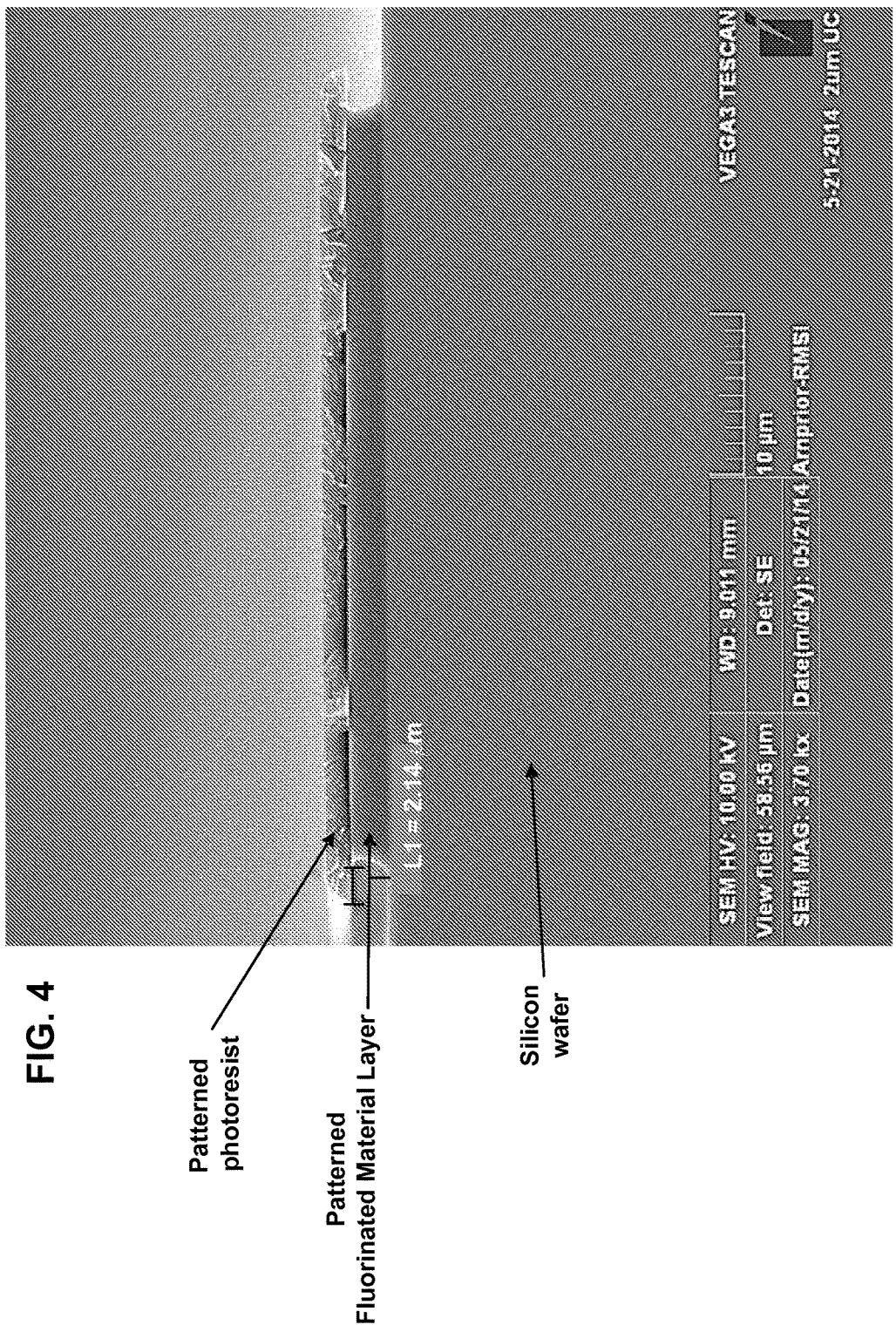
FIG. 4 is an SEM photograph showing a cross-section of an undercut lift-off structure of the present disclosure.

Bilayer lift-off structures were prepared using a fluorinated material layer comprising the material used in Sample 3, nLOF 2020 photoresist coated over the fluorinated material. The nLOF was pattern-exposed and developed in a conventional manner. A first pattern of openings was formed in the fluorinated material layer by contact with HFE-7300 as a base layer developing agent for 30 sec followed by a very short spray rinse, also with HFE-7300. A cross-sectional SEM image of the undercut lift-off structure is shown in FIG. 4. The undercut is approximately 2 µm wide in this example. The structure was readily lifted off by immersion in HFE-7100. Lift-off time depended upon feature dimensions, in particular, separation of features. Lines spaced 50 µm apart lifted off in just 1 minute. Lines spaced 1000 µm apart took about 10 to 11 minutes, which is still reasonable in a manufacturing setting. Lift-off times could be reduced in half or even less by heating the HFE-7100 to 50° C. Alternatively, heated HFE-7300 has been found to be effective to lift off structures spaced 50 µm apart.

Using lift-off structures as described above, an array of red, green and blue emitting OLED pixels were fabricated by depositing a first OLED stack (red, green or blue) through a bilayer lift-off structure opening, followed by lift-off, formation of a new lift-off structure and deposition of the next OLED stack color. Each pixel was 10 µm wide and 36 µm long, each separated by only 4 µm in the horizontal direction between different color stacks and 6 µm in the vertical direction (between common color stacks). Thus, each set of RGB pixels was 40 µm×40 µm, which corresponds to a 635 dpi resolution color display with n emissive fill factor (aperture ratio) of 61%.

The authors have found that commercially available perfluorinated fluoropolymer (Cytop 809A) has a very limited set of fluorosolvents that can be used to develop or lift-off structures similar to those described above. Of the many fluorinated solvents tested it was surprisingly found that HFE 7300 (surprisingly not a perfluorinated solvent) had the highest dissolution rate at room temperature (about 70 nm/sec). While this can make a good developer solvent, it is far too slow for lift-off at room temperature. The authors have found that acceptable lift-off can be obtained by heating the HFE 7300. That is fine for substrates that can handle such heating, but may not always be acceptable. Further, conventional photoresists such as nLOF 2020 have been very difficult to coat uniformly due to the poor wetting properties over Cytop. The partially fluorinated polymers disclosed above, such as that used in Sample 3, show improved wetting of nLOF relative to Cytop and have a wide variety of useful developing and lift-off fluorinated solvents available.

LIST OF REFERENCE NUMBERS USED IN THE DRAWINGS

10 OLED Device
11 anode
12 hole-injecting layer (HIL)
13 hole-transporting layer (HTL)
14 electron-blocking layer (EBL)
15 light-emitting layer (LEL)
16 hole-blocking layer (HBL)
17 electron-transporting layer (ETL)
18 electron-injecting layer (EIL)
19 cathode
20 organic EL medium
301 form base layer step
303 form photoresist layer step
305 expose the photoresist layer step
306 develop the exposed photoresist layer step
307 remove pattern of uncovered base layer step
308 deposit active material step
309 remove lift-off structure step
310 device substrate
310a active area
310s sensitive area
311 base layer
312 photoresist layer
313 radiation source
314 photomask
315 exposed photoresist layer
316 pattern of exposed photoresist regions
317 pattern of unexposed photoresist regions
318 pattern of uncovered base layer
319 lift-off structure
320 pattern of openings
320A pattern of uncovered substrate
321 undercut region
346 active material
346' active material
350 patterned structure

The invention claimed is:

1. A method of making a device comprising:
 a) providing a device substrate having one or more target areas for patterning;
 b) providing a fluorinated material layer over the device substrate;
 c) forming one or more lift-off structures at least in part by developing a first pattern of one or more open areas in the fluorinated material layer in alignment with the one or more target areas by contact with a developing agent comprising a fluorinated solvent, wherein the developing agent dissolves the fluorinated material at a first rate;
 d) patterning the device substrate by
  i) etching at least a portion of the one or more target areas using the one or more lift-off structures as an etch mask, or
  ii) depositing one or more active material layers through the first pattern of open areas and onto the one or more target areas, or
  both i) and ii); and
 e) removing the one or more lift-off structures by contact, at a temperature that is at least 10° C. higher than contact with the developing agent, with a lift-off agent comprising a fluorinated solvent wherein the lift-off agent dissolves the fluorinated material at a second rate that is at least 150 nm/sec and higher than the first rate.

2. The method of claim 1 wherein contact with the developing agent is conducted at a temperature in a range of 15° C. to 25° C. and contact with the lift-off agent is conducted in a range of 35° C. to 65° C.

3. The method of claim 1 wherein the composition of the lift-off agent includes a different fluorinated solvent than the developing agent.

4. The method of claim 1 wherein the developing agent comprises a mixture of first and second fluorinated solvents and the lift-off agent comprises at least one of the first and second fluorinated solvents at a different concentration than in the developing agent.

5. The method of claim 1 wherein the lift-off agent comprises a mixture of first and second fluorinated solvents and the developing agent comprises at least one of the first and second fluorinated solvents at a different concentration than in the lift-off agent.

6. The method of claim 1 wherein the fluorinated material layer includes a copolymer comprising at least two distinct repeating units including a first repeating unit having a fluorine-containing group and a second repeating unit having a non-photoactive functional group that does not include a protic substituent, wherein the copolymer has a total fluorine content of at least 45% by weight.

7. The method according to claim 6 wherein the functional group includes an aliphatic hydrocarbon that does not include a protic substituent.

8. The method according to claim 7 wherein the copolymer has a total fluorine content in a range of 46 to 53% by weight.

9. The method according to claim 6 wherein the functional group includes an aromatic hydrocarbon that does not include a protic substituent.

10. The method of claim 1 wherein the fluorinated material layer is substantially not directly photopatternable by exposure to radiation having a wavelength of 365 nm or above.

11. The method according to of claim 1 wherein the one or more lift-off structures further includes a patterned resist provided over the fluorinated material layer, wherein the patterned resist acts as an etch mask for the developing of the first pattern of open areas in the fluorinated material layer.

12. The method according to claim 11 wherein the patterned resist is provided by printing a resist material.

13. The method according to claim 12 wherein the printing includes ink jet printing, flexographic printing, gravure printing, screen printing, electrophotographic printing, or laser or thermal transfer of the resist material from a donor sheet.

14. The method according to claim 11 wherein the patterned resist is provided by photoimaging a photoresist material.

15. The method according to claim 14 wherein the photoresist material is provided from a composition comprising a non-fluorinated solvent.

16. The method according to claim 15 wherein the non-fluorinated solvent is water or an alcohol.

17. The method according to claim 15 wherein the non-fluorinated solvent is a non-protic, non-aromatic organic solvent having an ether group, an ester group, a ketone group or a combination thereof, or a non-protic aromatic organic solvent.

18. The method according to claim 14 wherein the photoresist material is a fluorinated photoresist material provided from a composition comprising a fluorinated solvent selected not to dissolve a substantial portion of the underlying fluorinated material layer.

19. The method of claim 1 wherein the deposition of the one or more active material layers includes vapor deposition.

20. The method of claim 1 wherein the deposition of the one or more active material layers includes deposition from a liquid comprising at least one of the active materials.

21. The method of claim 1 wherein the one or more lift-off structures has a thickness in a range of 0.2 to 5.0 μm.

22. The method of claim 1 wherein the active material is an active organic material.

23. The method of claim 1 wherein the device is a display device, a touch-sensitive device, an OLED device, an OTFT device, a photovoltaic device, a bioelectronic device, a medical device, a MEMS device or an integrated circuit chip.

24. The method of claim 1 wherein the substrate comprises a substrate layer having an active organic material and at least one lift-off structure covers at least a portion of the substrate layer having the active organic material.

* * * * *